(12) United States Patent
Sun et al.

(10) Patent No.: US 11,004,973 B2
(45) Date of Patent: *May 11, 2021

(54) SEMICONDUCTOR DEVICE WITH CONTAMINATION IMPROVEMENT

(71) Applicant: TAIWAN SEMICONDUCTOR MANUFACTURING COMPANY LIMITED, Hsin-Chu (TW)

(72) Inventors: Chung-Ren Sun, Kaohsiung (TW); Shiu-Ko Jangjian, Tainan (TW); Kun-Ei Chen, Tainan (TW); Chun-Che Lin, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,567

(22) Filed: Jun. 3, 2019

(65) Prior Publication Data

US 2019/0288110 A1    Sep. 19, 2019

Related U.S. Application Data

(60) Continuation of application No. 15/663,636, filed on Jul. 28, 2017, now Pat. No. 10,312,366, which is a
(Continued)

(51) Int. Cl.
*H01L 29/66* (2006.01)
*H01L 29/78* (2006.01)
(Continued)

(52) U.S. Cl.
CPC .... *H01L 29/7831* (2013.01); *H01L 21/76801* (2013.01); *H01L 21/76829* (2013.01);
(Continued)

(58) Field of Classification Search
CPC ........... H01L 29/7831; H01L 21/76801; H01L 21/823437; H01L 21/76829;
(Continued)

(56) References Cited

U.S. PATENT DOCUMENTS 9,722,076 B2 * 8/2017 Sun ..................... H01L 29/7831
2006/0223290 A1  10/2006 Belyansky et al.
(Continued)

*Primary Examiner* — Bitew A Dinke
(74) *Attorney, Agent, or Firm* — Cooper Legal Group, LLC

(57) ABSTRACT

A semiconductor device includes a substrate, two gate structures, an interlayer dielectric layer and a material layer. The substrate has at least two device regions separated by at least one isolation structure disposed in the substrate. Each device region includes two doped regions in the substrate. The gate structures are respectively disposed on the device regions. In each device region, the doped regions are respectively disposed at two opposite sides of the gate structure. The interlayer dielectric layer is disposed over the substrate and peripherally surrounds the gate structures. A top of the interlayer dielectric layer has at least one concave. The material layer fills the concave and has a top surface elevated at the same level with top surfaces of the gate structures. A ratio of a thickness of a thickest portion of the material layer to a pitch of the gate structures ranges from 1/30 to 1/80.

20 Claims, 13 Drawing Sheets

Related U.S. Application Data division of application No. 14/839,932, filed on Aug. 29, 2015, now Pat. No. 9,722,076.

(51) Int. Cl.
  *H01L 21/8234* (2006.01)
  *H01L 21/768* (2006.01)

(52) U.S. Cl.
  CPC .. *H01L 21/823437* (2013.01); *H01L 29/6656* (2013.01); *H01L 29/66545* (2013.01); *H01L 21/7684* (2013.01)

(58) Field of Classification Search
  CPC ........... H01L 29/66545; H01L 29/6656; H01L 21/7684; H01L 29/78
  See application file for complete search history.

(56) References Cited

U.S. PATENT DOCUMENTS

| | | | |
|---|---|---|---|
| 2007/0049053 A1 | 3/2007 | Mahajani | |
| 2010/0087056 A1 | 4/2010 | Chung et al. | |
| 2010/0330808 A1* | 12/2010 | Richter | H01L 21/823807 438/691 |
| 2011/0215404 A1 | 9/2011 | Zhu et al. | |
| 2011/0244670 A1* | 10/2011 | Richter | H01L 21/76819 438/585 |
| 2011/0309451 A1 | 12/2011 | Tsukamoto | |
| 2012/0025323 A1* | 2/2012 | Teo | H01L 21/823425 257/384 |
| 2012/0052666 A1 | 3/2012 | Choi | |
| 2012/0086048 A1* | 4/2012 | Park | H01L 21/823425 257/192 |
| 2012/0126295 A1 | 5/2012 | Edge et al. | |
| 2012/0248550 A1* | 10/2012 | Huang | H01L 29/66545 257/410 |
| 2012/0264281 A1* | 10/2012 | Chen | H01L 21/823437 438/591 |
| 2013/0105903 A1* | 5/2013 | Chang | H01L 29/66545 257/369 |
| 2013/0137264 A1 | 5/2013 | Yin et al. | |
| 2013/0214335 A1* | 8/2013 | Prindle | H01L 21/823437 257/288 |
| 2013/0334580 A1 | 12/2013 | Cheng et al. | |
| 2014/0015104 A1 | 1/2014 | Su et al. | |
| 2014/0097496 A1 | 4/2014 | Hu et al. | |
| 2014/0103441 A1* | 4/2014 | Kim | H01L 21/82345 257/368 |
| 2014/0183648 A1* | 7/2014 | Chuang | H01L 21/82385 257/369 |
| 2014/0231924 A1* | 8/2014 | Kuo | H01L 29/785 257/401 |
| 2014/0235044 A1* | 8/2014 | Liu | H01L 21/02107 438/585 |
| 2014/0252431 A1* | 9/2014 | Lee | H01L 29/785 257/288 |
| 2014/0264778 A1* | 9/2014 | Lim | H01L 21/28194 257/632 |
| 2015/0079780 A1* | 3/2015 | Liu | H01L 29/66545 438/595 |
| 2015/0108589 A1 | 4/2015 | Cheng et al. | |
| 2015/0145054 A1* | 5/2015 | Bu | H01L 21/31144 257/368 |
| 2015/0194524 A1 | 7/2015 | Hu et al. | |
| 2015/0206949 A1* | 7/2015 | Zhao | H01L 29/495 257/410 |
| 2015/0206956 A1* | 7/2015 | Kim | H01L 29/66795 438/294 |
| 2015/0287611 A1* | 10/2015 | Zhao | H01L 21/02164 257/368 |
| 2015/0318185 A1 | 11/2015 | Kodaira et al. | |
| 2016/0093617 A1* | 3/2016 | Park | H01L 27/0922 257/369 |
| 2016/0104788 A1* | 4/2016 | Ryu | H01L 29/66545 438/586 |
| 2016/0225628 A1 | 8/2016 | Ando et al. | |
| 2016/0351712 A1* | 12/2016 | Chiang | H01L 29/7845 |

* cited by examiner

SEMICONDUCTOR DEVICE WITH CONTAMINATION IMPROVEMENT

RELATED APPLICATIONS

This is a continuation application of U.S. patent application Ser. No. 15/663,636, filed on Jul. 28, 2017, which is a divisional application of U.S. patent application Ser. No. 14/839,932, filed on Aug. 29, 2015. U.S. patent application Ser. No. 15/663,636 and U.S. patent application Ser. No. 14/839,932 are incorporated herein by reference in their entireties.

BACKGROUND

The semiconductor integrated circuit (IC) industry has experienced rapid growth. In the course of the IC evolution, functional density (defined as the number of interconnected devices per chip area) has generally increased while geometry size (i. e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of semiconductor devices such as metal oxide semiconductor field effect transistors (MOSFETs). However, existing semiconductor devices and methods of fabricating the semiconductor devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
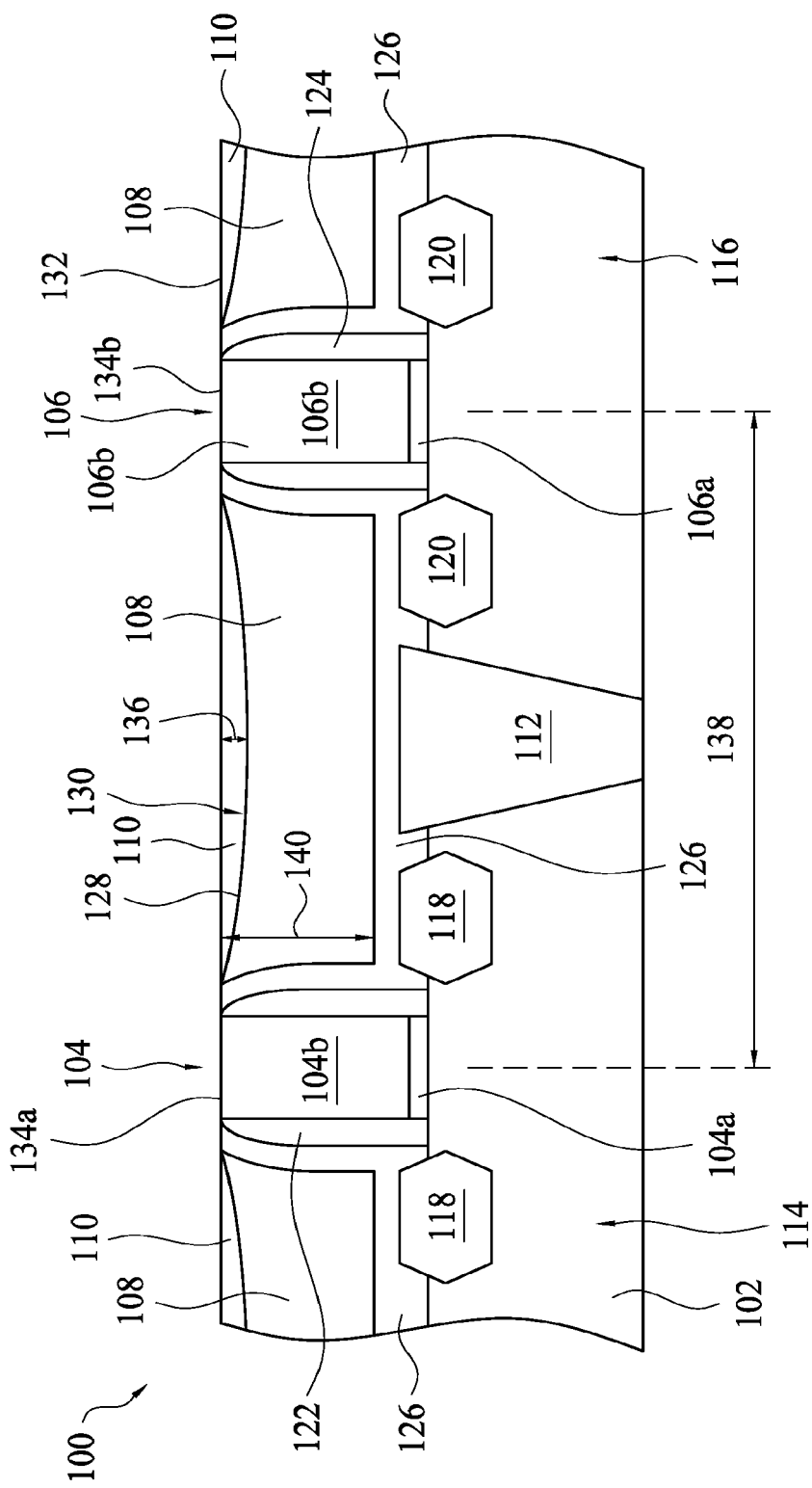
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical method for manufacturing a semiconductor device, after an interlayer dielectric layer is formed to cover dummy gate structures and to fill between the dummy gate structures, a chemical mechanical polishing (CMP) process is performed to remove an excess portion of the interlayer dielectric layer to expose tops of dummy gate electrodes of the dummy gate structures. Next, the dummy gate electrodes are removed by using an etching process to form cavities, and gate electrodes are respectively formed in the cavities for replacing the dummy gate electrodes. However, the etching process may damage the interlayer dielectric layer. In addition, after the chemical mechanical polishing process and the etching process are performed, process byproducts or contaminants remain on the interlayer dielectric layer, and the process byproducts or the contaminants flow into the cavities during a subsequent wet clean operation, thus contaminating the cavities and the gate electrodes. Consequently, a yield of the process is reduced, and reliability of the semiconductor device is lowered.

Embodiments of the present disclosure are directed to providing a semiconductor device and a method for manufacturing the semiconductor device, in which before an operation of replacing dummy gate electrodes with gate electrodes, an interface layer is formed to cover dummy gate structures and an interlayer dielectric layer. The interface layer is harder to be removed than the interlayer dielectric layer, and the interface layer has a CMP selectivity with respect to the gate electrodes, such that the interface layer can protect the interlayer dielectric layer during the operation of replacing the dummy gate electrodes, and can prevent contaminants generated in an implant operation, a CMP operation and/or an etching operation from contaminating the gate electrodes. Furthermore, because the interface layer has a CMP selectivity with respect to the gate electrodes, a better control on the height of the gate structures can be achieved.

FIG. 1 is schematic cross-sectional view of a semiconductor device in accordance with various embodiments. In some embodiments, a semiconductor device 100 is a MOSFET. As shown in FIG. 1, the semiconductor device 100 includes a substrate 102, at least two gate structures, an interlayer dielectric layer 108 and a material layer 110. For example, the semiconductor device 100 includes two gate structures 104 and 106. The substrate 102 is a semiconductor substrate, and may be composed of a single-crystalline semiconductor material or a compound semiconductor material. For example, the substrate 102 is a silicon substrate. In some examples, germanium or glass may also be used as a material of the substrate 102.

In some examples, at least one isolation structure 112 is disposed in the substrate 102 to define at least two device regions in the substrate 102, such as two device regions 114 and 116. For example, the isolation structure 112 may be a shallow trench isolation (STI) structure. The isolation structure 112 may be formed from silicon oxide. Referring to FIG. 1 again, the semiconductor device 100 further includes two doped regions 118 and two doped regions 120 disposed in the substrate 102. The doped regions 118 are disposed in the device region 114, and the doped regions 120 are disposed in the device region 116. The doped regions 118 and 120 are formed by implanting dopants into the substrate 102. The conductivity types of the dopants of the doped regions 118 and 120 are different from each other. For example, the conductivity type of the doped regions 118 may be p type or n type, while the conductivity type of the doped regions 120 may be the other conductivity type. When the doped regions 118 or 120 are of n type, phosphorous (P) may be used as the dopants. When the doped regions 118 or 120 are of p type, germanium (Ge) may be used as the dopants.

The gate structures 104 and 106 are respectively disposed in the device regions 114 and 116 on the substrate 102. In the device region 114, the doped regions 118 are respectively disposed at two opposite sides of the gate structure 104. One of the doped regions 118 may be a source region, and the other of the doped regions 118 may be a drain region. In the device region 116, the doped regions 120 are respectively disposed at two opposite sides of the gate structure 106. One of the doped regions 120 may be a source region, and the other of the doped regions 120 may be a drain region. In some examples, the gate structure 104 includes a gate dielectric layer 104a and a gate electrode 104b, in which the gate dielectric layer 104a is disposed on the substrate 102, and the gate electrode 104b is disposed on the gate dielectric layer 104a. The gate structure 106 includes a gate dielectric layer 106a and a gate electrode 106b, in which the gate dielectric layer 106a is disposed on the substrate 102, and the gate electrode 106b is disposed on the gate dielectric layer 106a. In some exemplary examples, the gate dielectric layers 104a and 106a are formed from silicon oxide, and the gate electrodes 104b and 106b are formed from metal.

In some examples, as shown in FIG. 1, the semiconductor device 100 further includes two spacers 122 and 124. The spacer 122 peripherally surrounds the gate structure 104, and the spacer 124 peripherally surrounds the gate structure 106. The spacers 122 and 124 are formed from dielectric materials.

In some examples, as shown in FIG. 1, according to process requirements, the semiconductor device 100 may further include an etching stop layer (ESL) 126. The etching stop layer 126 covers the substrate 102, the isolation structure 112, the doped regions 118 and 120, and the spacers 122 and 124. The etching stop layer 126 may be a contact etching stop layer (CESL) for fabricating contacts.

The interlayer dielectric layer 108 is disposed on the etching stop layer 126 to cover the substrate 102 and the gate structures 104 and 106. As shown in FIG. 1, the interlayer dielectric layer 108 peripherally surrounds the spacers 122 and 124, such that the interlayer dielectric layer 108 peripherally surrounds the gate structures 104 and 106. A material forming the interlayer dielectric layer 108 is different from a material forming the etching stop layer 126. In some exemplary examples, the interlayer dielectric layer 108 is formed from flowable oxide. For example, the interlayer dielectric layer 108 may be formed from silicon dioxide. A top 128 of the interlayer dielectric layer 108 has at least one concave 130 which may be formed during an operation of forming the interlayer dielectric layer 108 and/or an operation of removing an interface layer covering the interlayer dielectric layer 108.

Referring to FIG. 1 again, the material layer 110 fills the concave 130. A material forming the interlayer dielectric layer 108 is different from a material forming the material layer 110. For example, the material layer 110 may be formed from a dielectric material or metal. In some examples, the material layer 110 has a top surface 132 which is elevated at the same level with top surfaces 134a and 134b of the gate structures 104 and 106. In some exemplary examples, a ratio of a thickness 136 of a thickest portion of the material layer 110 to a pitch 138 of the gate structures 104 and 106 ranges from about 1/30 to about 1/80. For example, a ratio of the thickness 136 of the thickest portion of the material layer 110 to a thickness 140 of a thickest portion of the interlayer dielectric layer 108 may be greater than 0 and smaller than about 1/30.

Figure 2A:
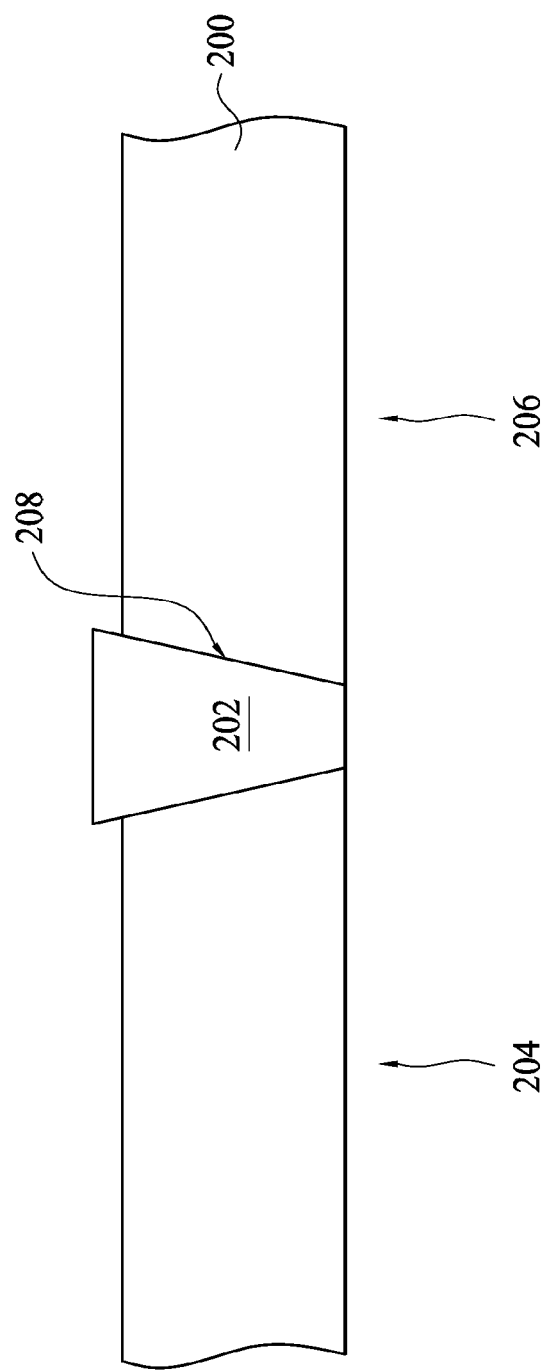
FIG. 2A through FIG. 2K are schematic cross-sectional views of intermediate stages showing a method for manufacturing a semiconductor device in accordance with various embodiments.

FIG. 2A through FIG. 2K are schematic cross-sectional views of intermediate stages showing a method for manufacturing a semiconductor device in accordance with various embodiments. As shown in FIG. 2A, a substrate 200 is provided. The substrate 200 is a semiconductor substrate, and may be composed of a single-crystalline semiconductor material or a compound semiconductor material. In some examples, silicon, germanium or glass may be used as a material of the substrate 200.

Referring to FIG. 2A again, at least one isolation structure 202 is formed in the substrate 200 to define at least two device regions 204 and 206 in the substrate 200, in which the device regions 204 and 206 are separated by the isolation structure 202. In some examples, the isolation structure 202 is a shallow trench isolation structure. For example, the operation of forming the isolation structure 202 may include forming a trench 208 in the substrate 200 by using a photolithography technique and an etching technique, depositing an isolation material layer to fill the trench 206 by using a plasma enhanced chemical vapor deposition (PECVD) technique, and removing an excessive portion of the isolation material layer by using a CMP technique.

Figure 2B:
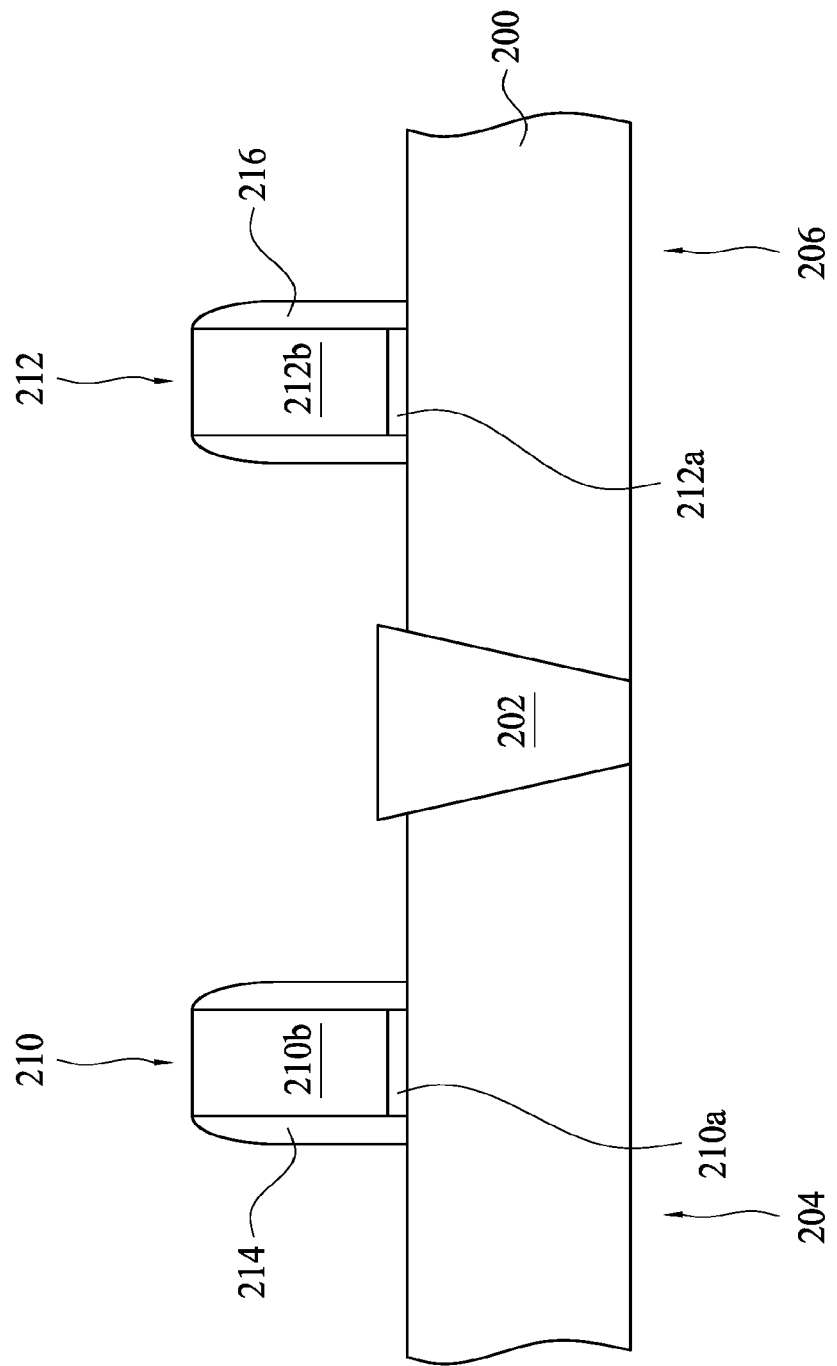

As shown in FIG. 2B, two dummy gate structures 210 and 212 are formed in the device regions 204 and 206 on the substrate 200 respectively. The dummy gate structure 210 includes a dummy gate electrode 210b, and the dummy gate structure 212 includes a dummy gate electrode 212b. In some examples, the dummy gate structure 210 further includes a gate dielectric layer 210a, and the dummy gate structure 212 further includes a gate dielectric layer 212a. In the dummy gate structure 210, the gate dielectric layer 210a is disposed on the substrate 200, and the dummy gate electrode 210b is disposed on the gate dielectric layer 210a. In the dummy gate structure 212, the gate dielectric layer 212a is disposed on the substrate 200, and the dummy gate electrode 212b is disposed on the gate dielectric layer 212a. In some exemplary examples, the gate dielectric layers 210a and 212a are formed from silicon oxide, and the dummy gate electrodes 210b and 212b are formed from polysilicon.

In some exemplary examples, as shown in FIG. 2B, after the operation of forming the dummy gate structures 210 and 212 is performed, two spacers 214 and 216 are formed on sidewalls of the dummy gate structures 210 and 212 respectively. The spacers 214 and 216 are formed to peripherally surround the dummy gate structures 210 and 212 respectively. In some exemplary examples, in the operation of forming the spacers 214 and 216, a spacer material layer is firstly formed to cover the substrate 200, the isolation structure 202, and the dummy gate structures 210 and 212. Then, an etching process is performed on the spacer material layer to remove a portion of the spacer material layer to expose a portion of the substrate 200, so as to form the spacers 214 and 216 respectively on the sidewalls of the dummy gate structures 210 and 212.

Figure 2C:
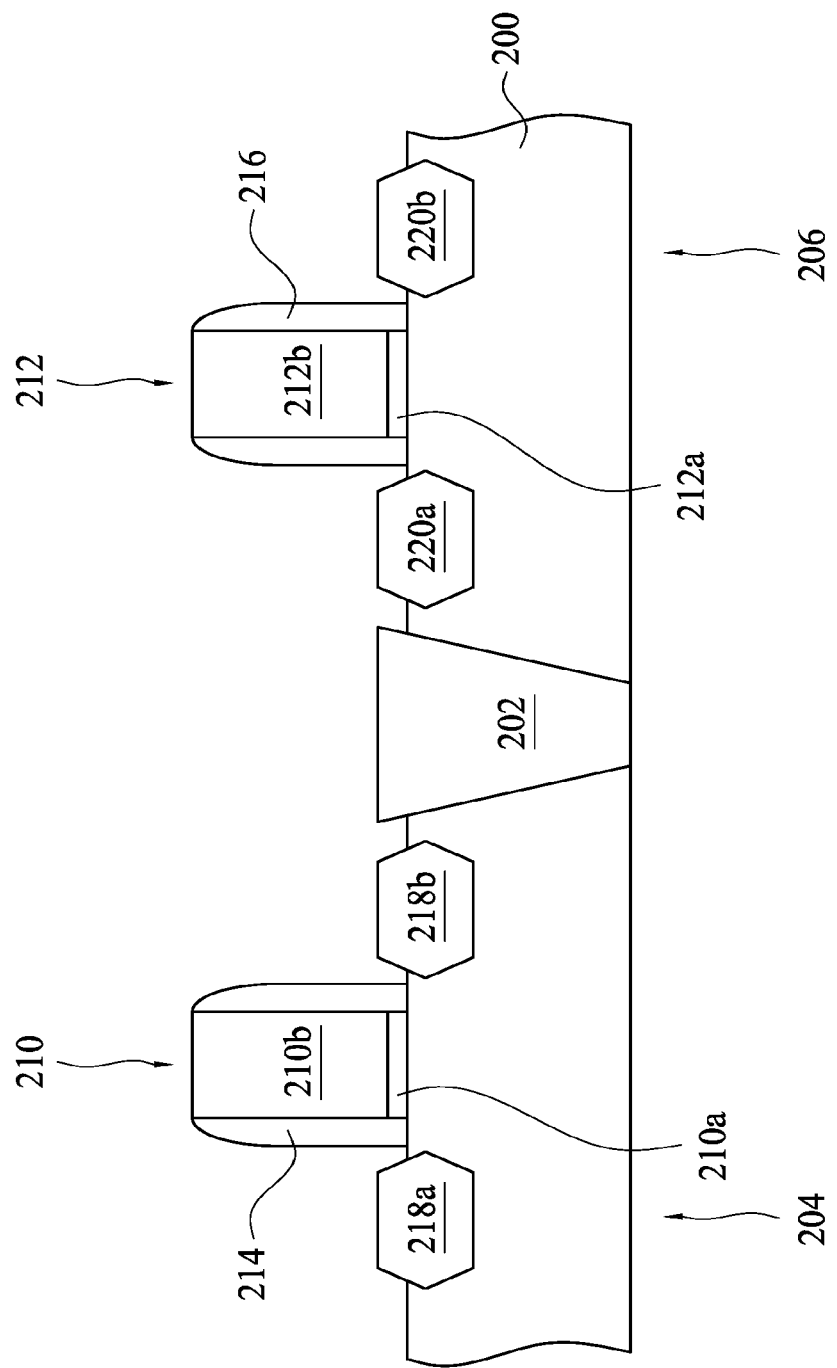

As shown in FIG. 2C, various doped regions 218a, 218b, 220a and 220b are formed in the substrate 202. The doped regions 218a, 218b, 220a and 220b are formed by implanting dopants into the substrate 200. The doped regions 218a and 218b are formed at two opposite sides of the dummy gate structure 210 respectively, in which the doped region 218a may be a source region, and the doped region 218b may be a drain region. The doped regions 220a and 220b are formed at two opposite sides of the dummy gate structure 212 respectively, in which the doped region 220a may be a source region, and the doped region 220b may be a drain region. A conductivity type of the doped regions 218a and 218b may be different from that of the doped regions 220a and 220b. In some examples, the conductivity type of the doped regions 218a and 218b is p type or n type, while the conductivity type of the doped regions 220a and 220b is the other conductivity type. For example, when the doped regions 218a and 218b or the doped regions 220a and 220b are of n type, phosphorous may be used as the dopants. When the doped regions 218a and 218b or the doped regions 220a and 220b are of p type, germanium may be used as the dopants.

Figure 2D:
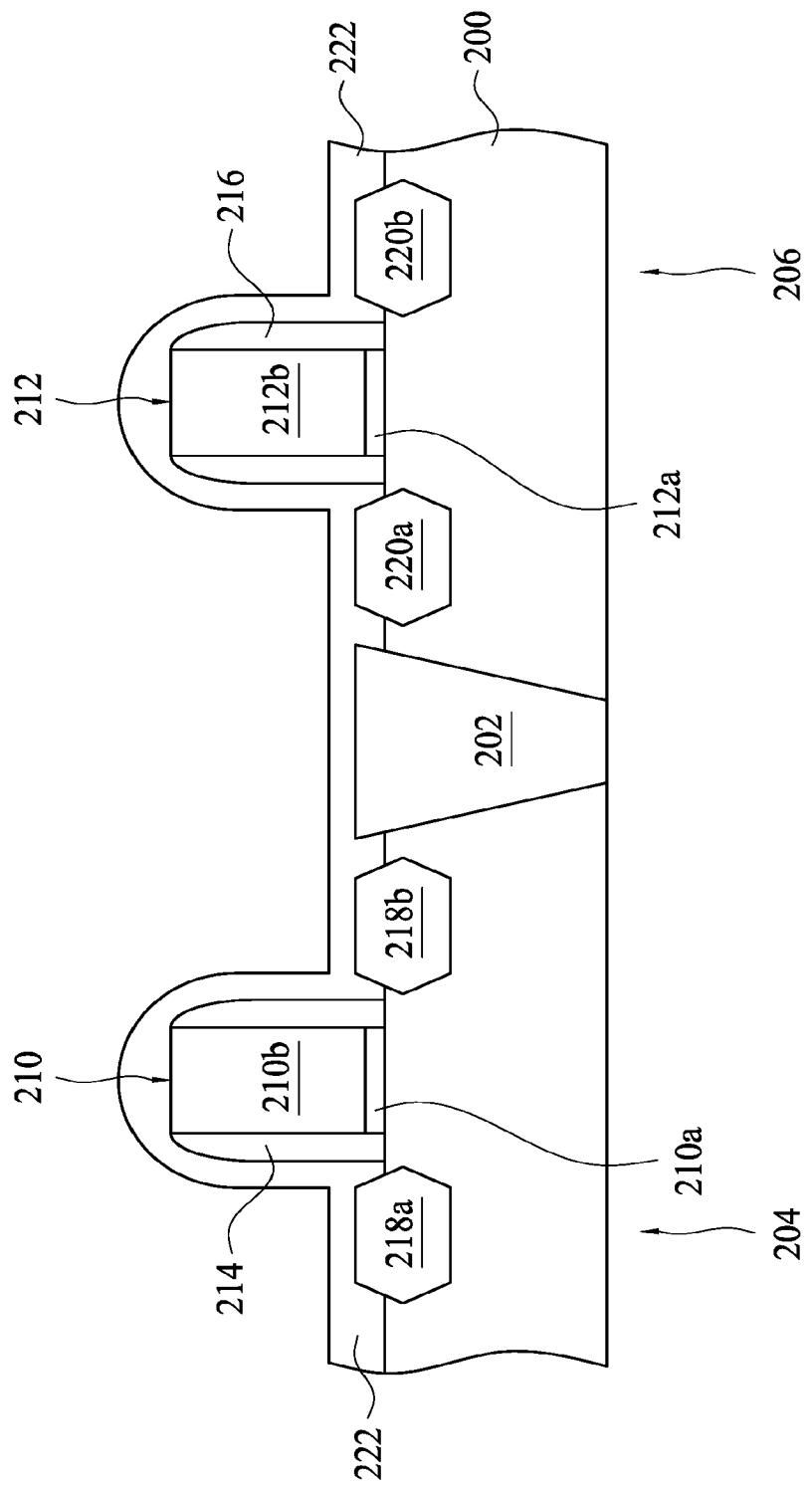

According to process requirements, as shown in FIG. 2D, after the operation of forming the doped regions 218a, 218b, 220a and 220b is completed, an etching stop layer 222 may be formed to conformally cover the substrate 200, the isolation structure 202, the doped regions 218a, 218b, 220a and 220b, the spacers 214 and 216, and the dummy gate structures 210 and 212. The etching stop layer 222 may be a contact etching stop layer for fabricating contacts. The etching stop layer 222 may be formed by a deposition technique, such as a chemical vapor deposition technique.

Figure 2E:
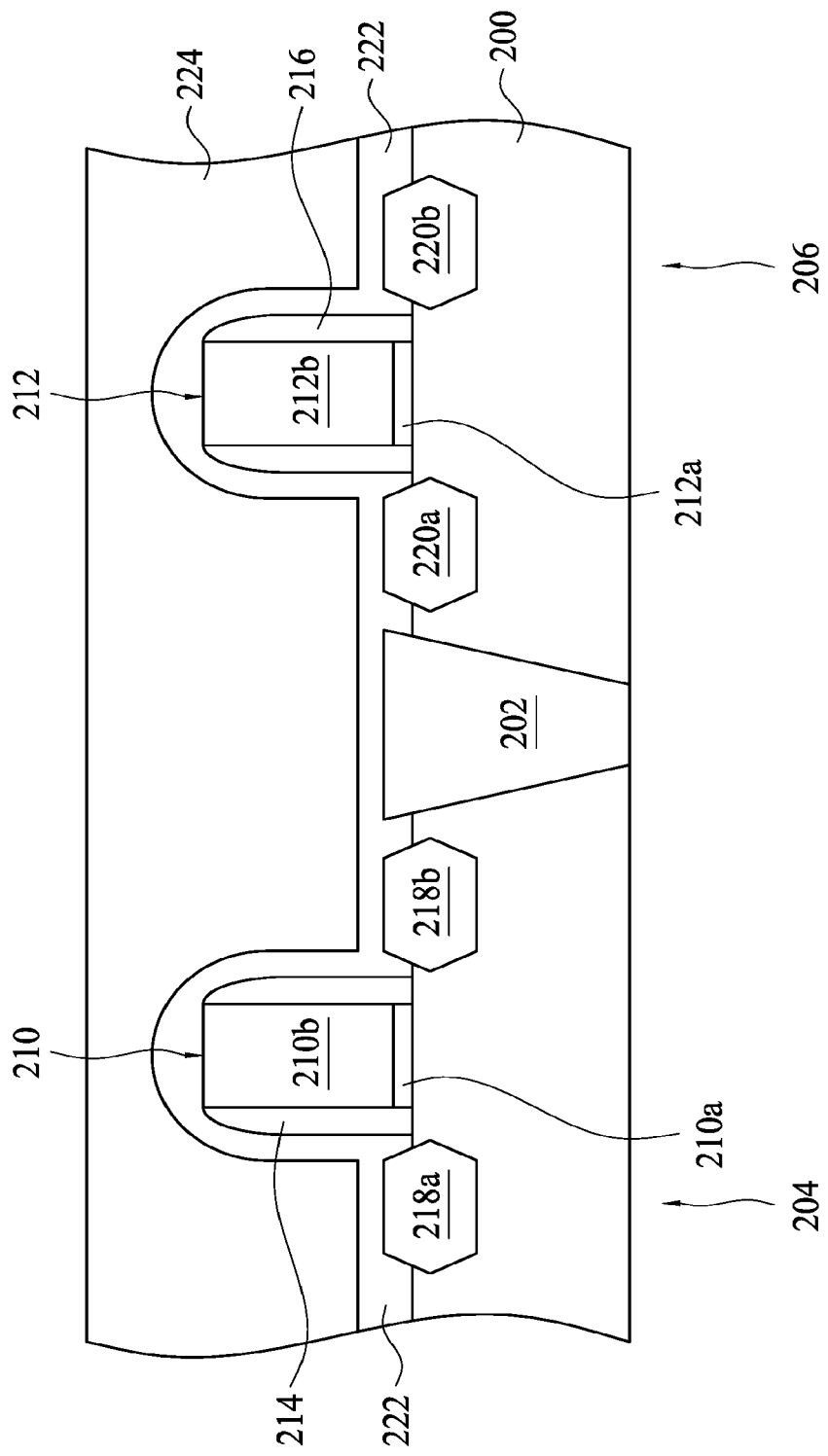

As shown in FIG. 2E, an interlayer dielectric material layer 224 is formed on the etching stop layer 222 to cover the substrate 200 and the dummy gate structures 210 and 212. A material forming the interlayer dielectric material layer 224 is different from a material forming the etching stop layer 222. In some exemplary examples, the interlayer dielectric material layer 224 is formed by using flowable oxide. For example, the interlayer dielectric material layer 224 may be formed from silicon dioxide.

Figure 2F:
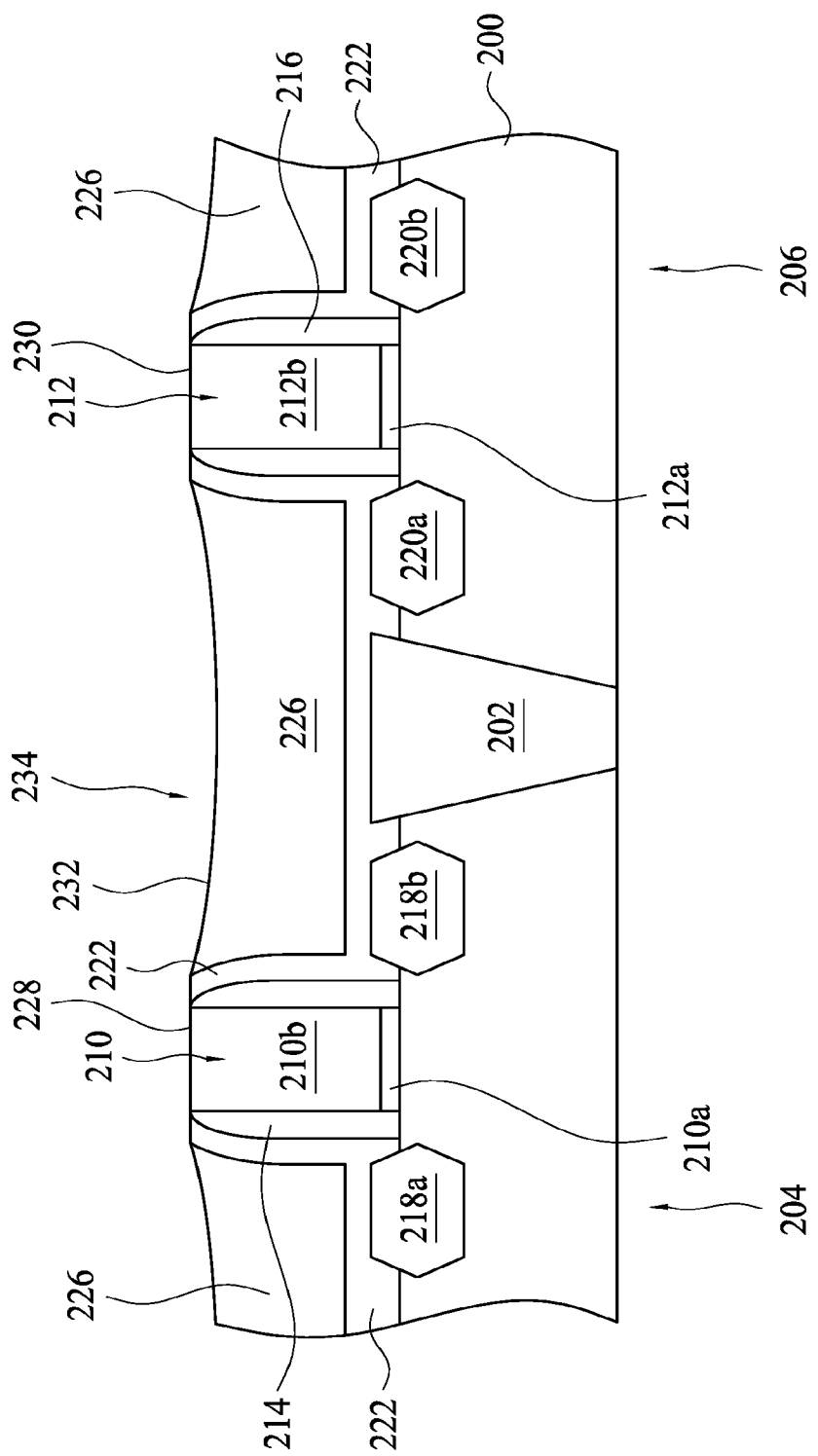

As shown in FIG. 2F, a planarization step is performed on the interlayer dielectric material layer 224 to remove a portion of the interlayer dielectric layer 224 and a portion of the etching stop layer 222 which is overlying a top 228 of the dummy gate electrode 210b and a top 230 of the dummy gate electrode 212b, so as to form an interlayer dielectric layer 226 and expose the tops 228 and 230 of the dummy gate electrodes 210b and 212b. The interlayer dielectric layer 226 peripherally surrounds the spacers 214 and 216, such that the interlayer dielectric layer 226 peripherally surrounds the dummy gate structures 210 and 212. In some examples, the planarization step is performed by using a CMP technique. In some exemplary examples, a top 232 of the interlayer dielectric layer 226 has at least one concave 234 after the planarization step is performed.

Figure 2G:
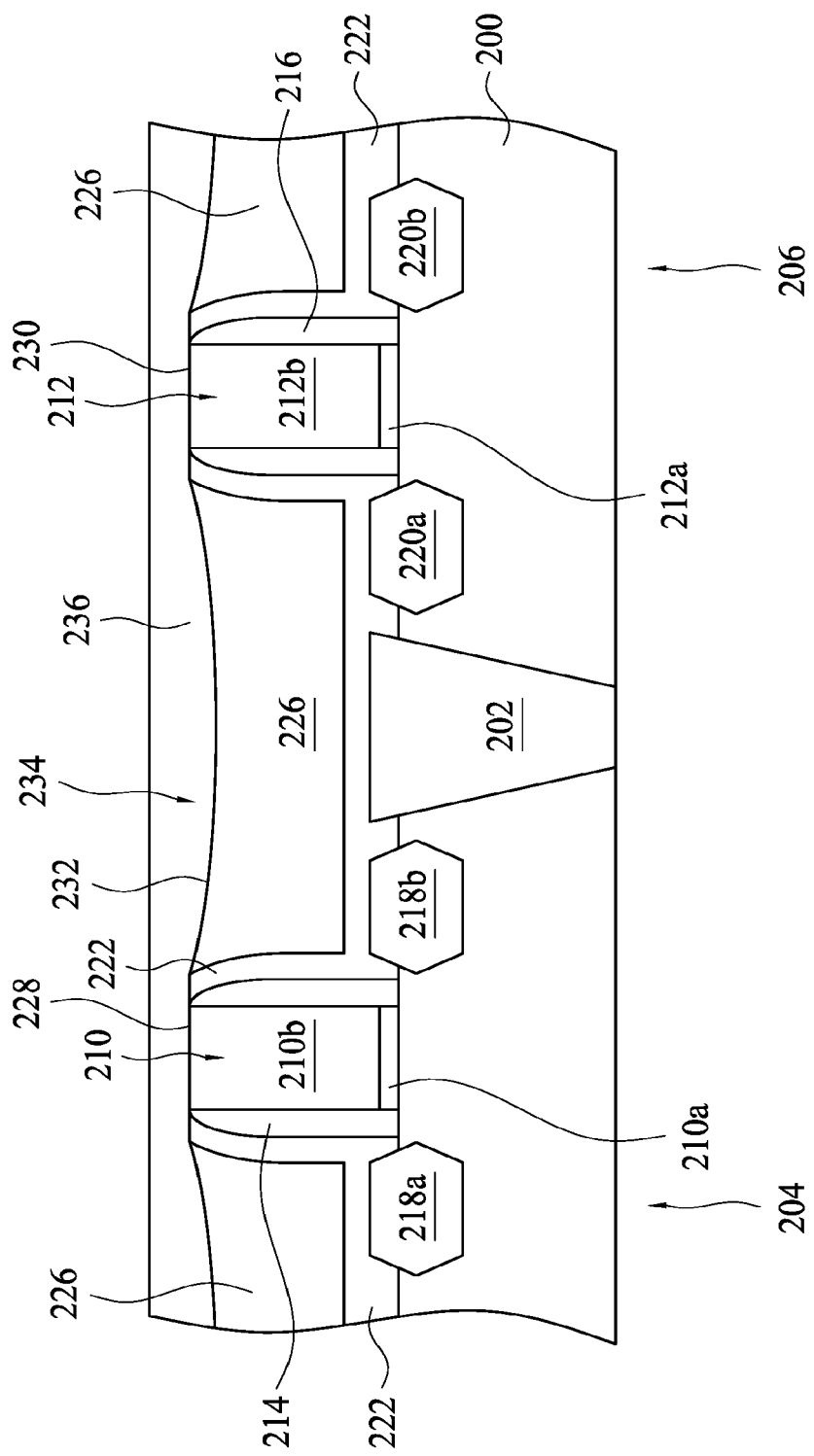

As shown in FIG. 2G, an interface layer 236 is formed on the interlayer dielectric layer 226 and the dummy gate structures 210 and 212. A material forming the interface layer 236 is different from that forming the interlayer dielectric layer 226. In some examples, the interface layer 236 is formed from silicon dioxide, silicon nitride or silicon oxynitride. The interface layer 236 is harder to be removed than the interlayer dielectric layer 226. For example, the operation of forming the interface layer 236 may be performed using a deposition process, an implant process, a plasma treatment process or an oxidization process. In the examples that the interface layer 236 is formed using the deposition process, a selective atomic layer deposition (ALD) process may be used to form the interface layer 236. In the examples that the interface layer 236 is formed using the implant process, the implant process may be performed with a high dose concentration and shallow depth. In the examples that the interface layer 236 is formed using the plasma treatment process, the plasma treatment process may be performed using nitrogen ($N_2$) as a working gas. In the examples that the interface layer 236 is formed using the oxidization process, the oxidization process may be performed using hydrogen peroxide ($H_2O_2$), tartaric acid ($C_4H_6O_6$) or citric acid ($C_6H_8O_7$) as an oxidant.

Figure 2H:
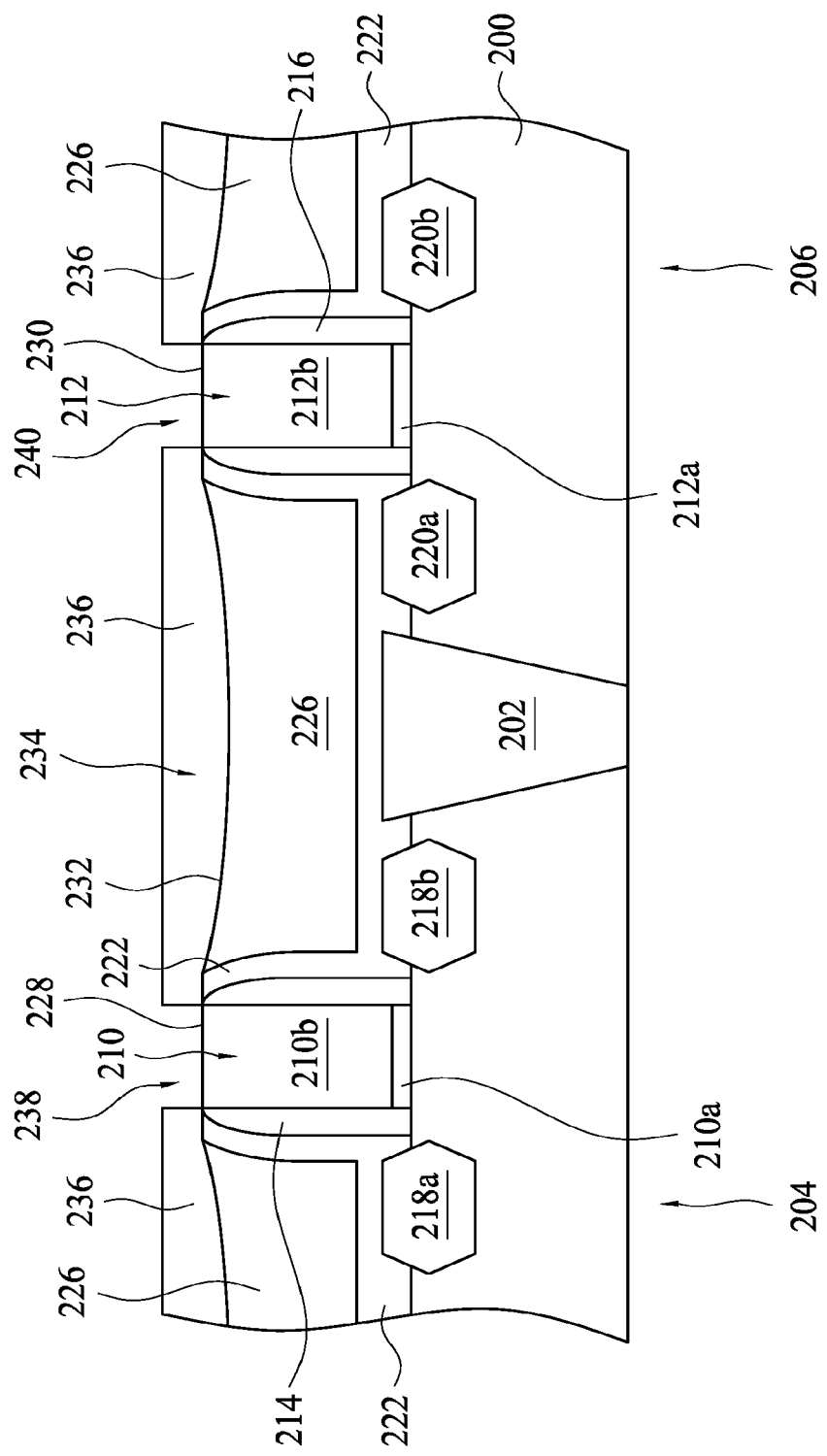

As shown in FIG. 2H, openings 238 and 240 are formed in the interface layer 236 to expose the top 228 of the dummy gate electrode 210b and the top 230 of the dummy gate electrode 212b. In some examples, the operation of forming the openings 238 and 240 is performed by using a photolithography technique and an etching technique, such as a dry etching technique.

Figure 2I:
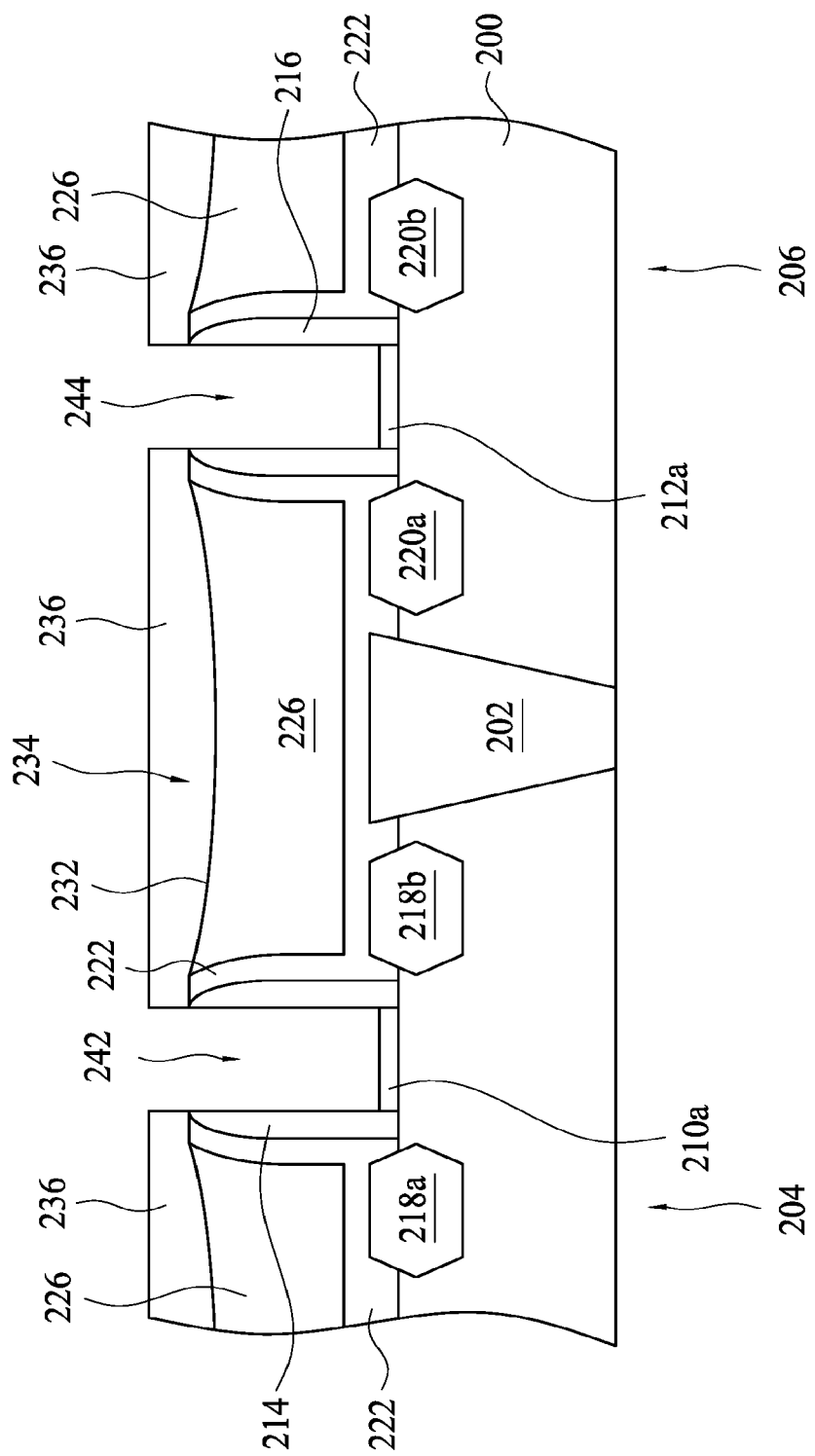
Figure 2J:
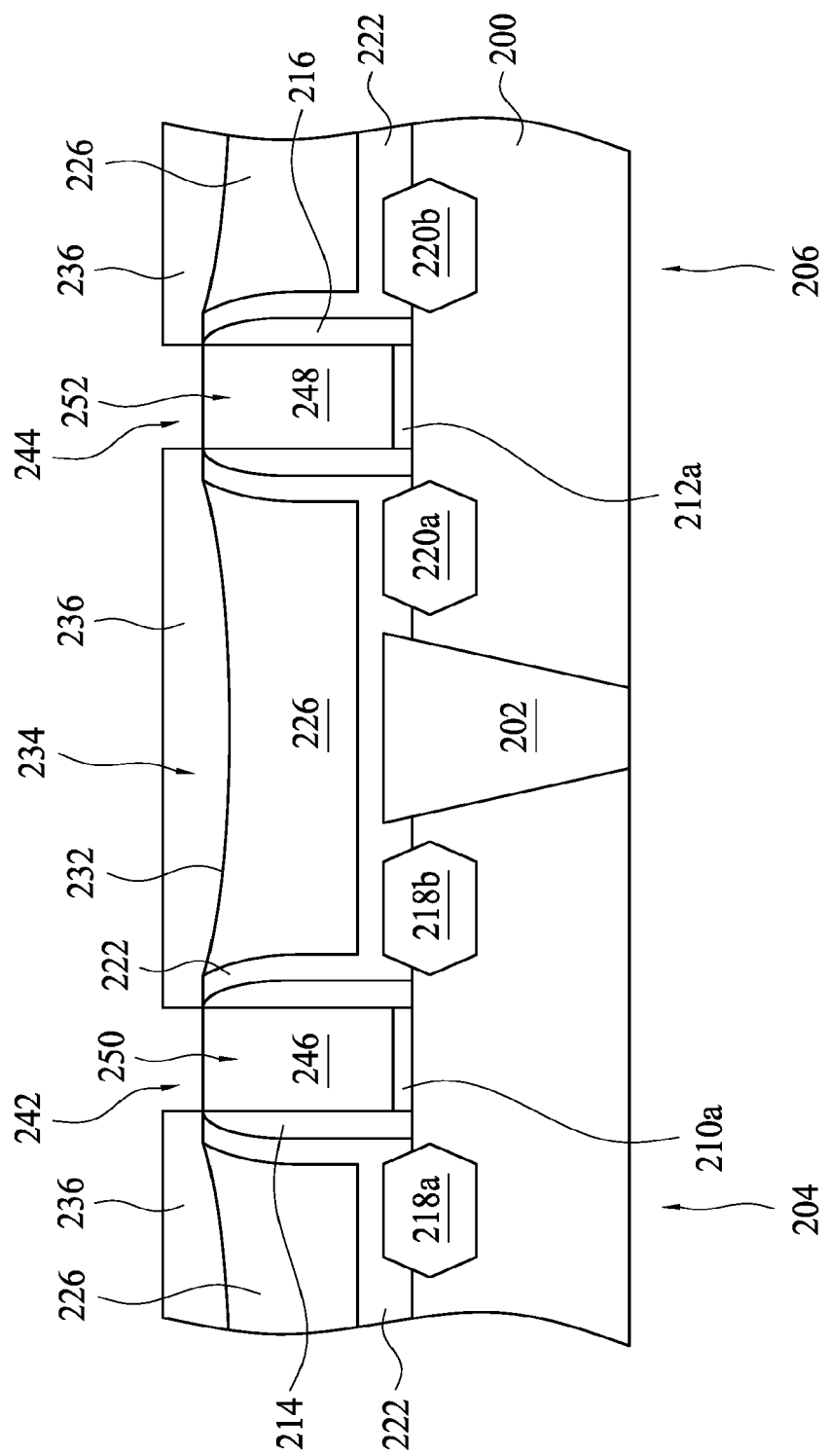

After the operation of forming the openings 238 and 240 is completed, the dummy gate electrodes 210b and 212b are replaced with two gate electrodes 246 and 248 to complete the fabrication of gate structures 250 and 252, as shown in FIG. 2J. The gate structure 250 includes the gate dielectric layer 210a and the gate electrode 246 on the gate dielectric layer 210a, and the gate structure 252 includes the gate dielectric layer 212a and the gate electrode 248 on the gate dielectric layer 212a. In some examples, the operation of replacing the dummy gate electrodes 210b and 212b with the gate electrodes 246 and 248 includes removing the dummy gate electrodes 210b and 212b respectively through the openings 238 and 240 by using, for example, an etching technique. The operation of removing the dummy gate electrodes 210b and 212b may be performed using a dry etching technique and/or a wet etching technique. As shown in FIG. 2I, after the dummy gate electrodes 210b and 212b are removed, cavities 242 and 244 are formed in the interlayer dielectric layer 226, in which the cavities 242 and 244 respectively expose the gate dielectric layers 210a and 212a.

After the dummy gate electrodes 210b and 212b are removed, a gate material layer (not shown) is formed to fill the cavities 242 and 244 and to cover the interface layer 236. The gate material layer may have a CMP selectivity with respect to the interface layer 236. The gate material layer may be formed from metal, such as tungsten (W). Next, a CMP process is performed on the gate material layer to remove a portion of the gate material layer overlying the interface layer 236, so as to form the gate electrodes 246 and 248 in the cavities 242 and 244 and expose the interface layer 236.

The interface layer 236 is harder to be removed than the interlayer dielectric layer 226, and the interface layer 236 has a CMP selectivity with respect to the gate electrodes 246 and 248, such that the interlayer dielectric layer 226 is protected by the interface layer 236 during the operation of removing the dummy gate electrodes 210b and 212b and the CMP process, thereby preventing contaminants generated in the implant operation, the CMP process and/or the etching operation from contaminating the gate electrodes 246 and 248. Moreover, the interface layer 236 has a CMP selectivity with respect to the gate electrodes 246 and 248, and thus a better control on the height of the gate structures 250 and 252 can be achieved.

Figure 2K:
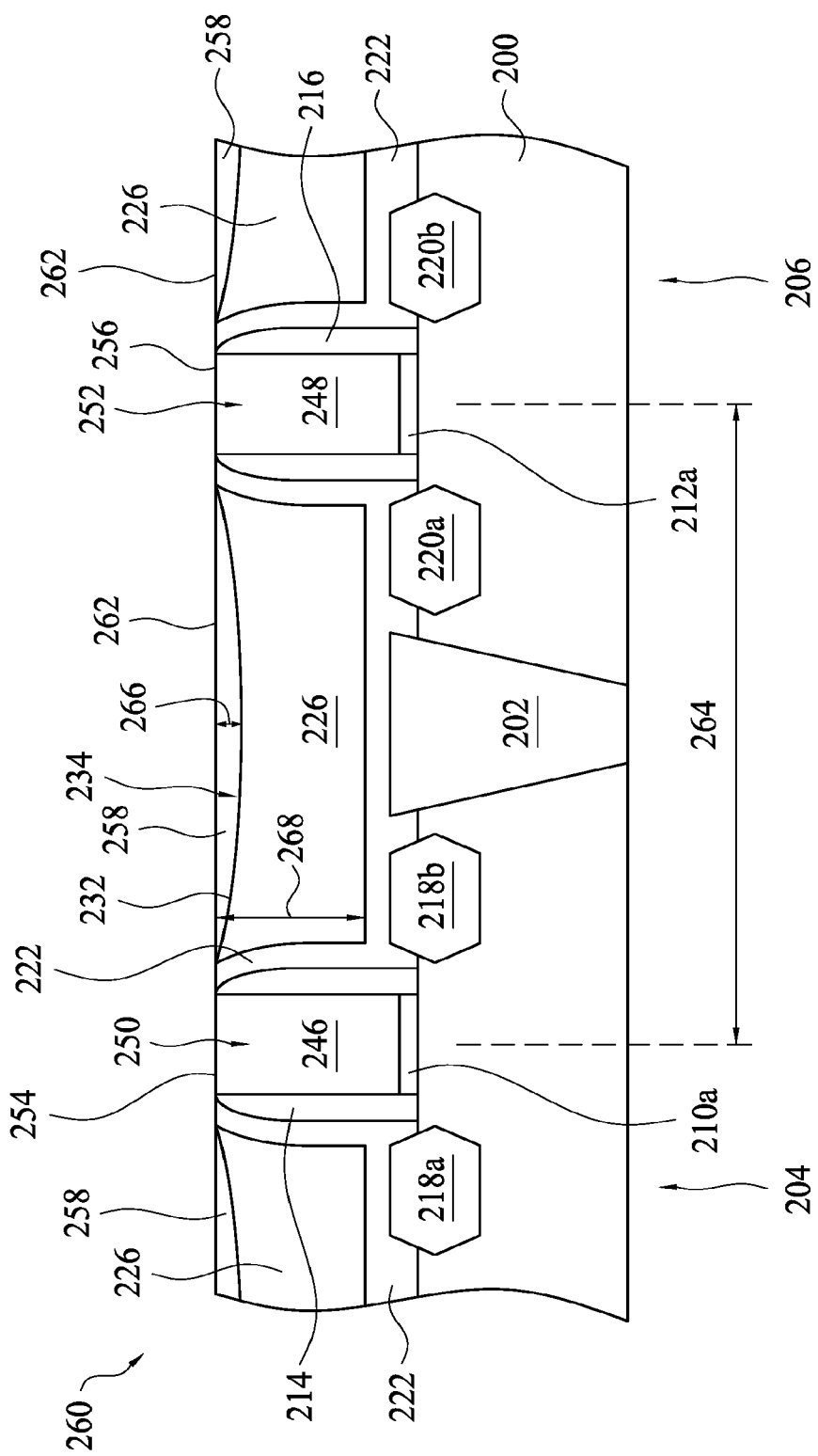

In some examples, after the operation of replacing the dummy gate electrodes 210b and 212b is completed, the interface layer 236 is removed to expose the top 232 of the interlayer dielectric layer 226. For example, the interface layer 236 may be removed by using an etching technique. Then, as shown in FIG. 2K, a material layer 258 is formed on the top 232 of the interlayer dielectric layer 226 and fills the concave 234 to complete the fabrication of a semiconductor device 260. The operation of forming the material layer 258 may include depositing the material layer 258 and planarizing the material layer 258. Thus, a top surface 262 of the material layer 258 is a flat surface. In some exemplary examples, the top surface 262 of the material layer 258 is elevated at the same level with a top 254 of the gate electrode 246 and a top 256 of the gate electrode 248.

Referring to FIG. 2I through FIG. 2K again, the interlayer dielectric layer 226 is protected by the interface layer 236 during the operation of replacing the dummy gate electrodes 210b, such that a depth of the concave 234 on the top 232 of the interlayer dielectric layer 226 is not increased. Thus, a ratio of a thickness 266 of a thickest portion of the material layer 258 to a pitch 264 of the gate electrodes 246 and 248 may range from about 1/30 to about 1/80. For example, a ratio of the thickness 266 of the thickest portion of the material layer 258 to a thickness 268 of a thickest portion of the interlayer dielectric layer 226 may be greater than 0 and smaller than about 1/30.

Figure 3:
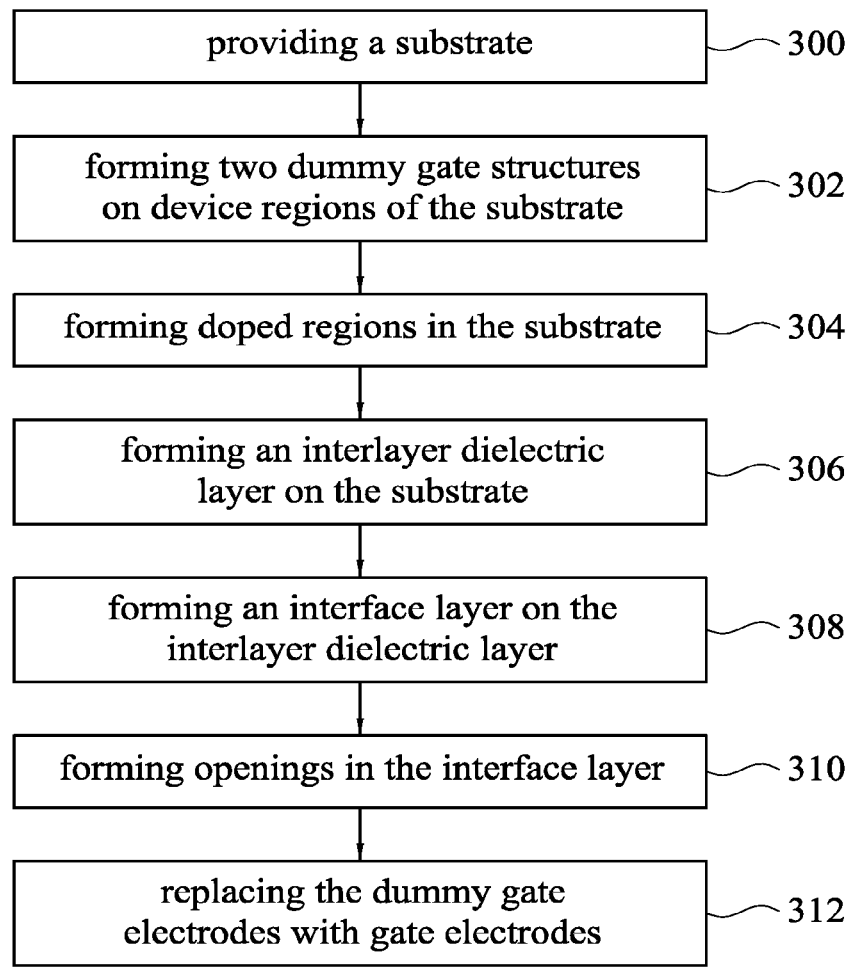
FIG. 3 is a flow chart of a method for manufacturing a semiconductor device in accordance with various embodiments.

Referring to FIG. 3 with FIG. 2A through FIG. 2K, FIG. 3 is a flow chart of a method for manufacturing a semiconductor device in accordance with various embodiments. The method begins at operation 300, where a substrate 200 is provided. In the operation of providing the substrate 200, as shown in FIG. 2A, at least one isolation structure 202 is formed in the substrate 200 to define at least two device regions 204 and 206 in the substrate 200. The device regions 204 and 206 are separated by the isolation structure 202. The isolation structure 202 may be a shallow trench isolation structure. For example, the operation of forming the isolation structure 202 may include forming a trench 208 in the substrate 200 by using a photolithography technique and an etching technique, depositing an isolation material layer to fill the trench 206 by using PECVD technique, and removing an excessive portion of the isolation material layer by using a CMP technique to form the isolation structure 202.

At operation 302, as shown in FIG. 2B, two dummy gate structures 210 and 212 are formed in the device regions 204 and 206 on the substrate 200 respectively. The dummy gate structure 210 includes a dummy gate electrode 210b, and the dummy gate structure 212 includes a dummy gate electrode 212b. In some examples, the dummy gate structure 210 further includes a gate dielectric layer 210a disposed on the substrate 200 and underlying the dummy gate electrode 210b, and the dummy gate structure 212 further includes a gate dielectric layer 212a disposed on the substrate 200 and underlying the dummy gate electrode 212b. The gate dielectric layers 210a and 212a may be formed from silicon oxide, and the dummy gate electrodes 210b and 212b may be formed from polysilicon.

In some exemplary examples, as shown in FIG. 2B, after the dummy gate structures 210 and 212 are formed, two spacers 214 and 216 are formed on sidewalls of the dummy gate structures 210 and 212 respectively. The spacers 214 and 216 are formed to peripherally surround the dummy gate structures 210 and 212 respectively. In some exemplary examples, in the operation of forming the spacers 214 and 216, a spacer material layer is firstly formed to cover the substrate 200, the isolation structure 202, and the dummy gate structures 210 and 212. Then, an etching process is performed on the spacer material layer to remove a portion of the spacer material layer to expose a portion of the substrate 200, so as to form the spacers 214 and 216.

At operation 304, as shown in FIG. 2C, various doped regions 218a, 218b, 220a and 220b are formed in the substrate 202 by implanting dopants into the substrate 200. The doped regions 218a and 218b are formed at two opposite sides of the dummy gate structure 210 respectively, in which the doped region 218a may be a source region, and the doped region 218b may be a drain region. The doped regions 220a and 220b are formed at two opposite sides of the dummy gate structure 212 respectively, in which the doped region 220a may be a source region, and the doped region 220b may be a drain region. A conductivity type of the doped regions 218a and 218b may be different from that of the doped regions 220a and 220b. For example, when the doped regions 218a and 218b or the doped regions 220a and 220b are of n type, phosphorous may be used as the dopants. When the doped regions 218a and 218b or the doped regions 220a and 220b are of p type, germanium may be used as the dopants.

In some examples, as shown in FIG. 2D, an etching stop layer 222 may be formed to conformally cover the substrate 200, the isolation structure 202, the doped regions 218a, 218b, 220a and 220b, the spacers 214 and 216, and the dummy gate structures 210 and 212 according to process requirements. The etching stop layer 222 may be a contact etching stop layer for fabricating contacts. The etching stop layer 222 may be formed by a deposition technique, such as a chemical vapor deposition technique.

At operation 306, as shown in FIG. 2E, an interlayer dielectric material layer 224 is formed on the etching stop layer 222 to cover the substrate 200 and the dummy gate structures 210 and 212. A material forming the interlayer dielectric material layer 224 is different from a material forming the etching stop layer 222. As shown in FIG. 2F, a planarization step is performed on the interlayer dielectric material layer 224 to remove a portion of the interlayer dielectric layer 224 and a portion of the etching stop layer 222 which is overlying a top 228 of the dummy gate electrode 210b and a top 230 of the dummy gate electrode 212b, so as to form an interlayer dielectric layer 226 and expose the tops 228 and 230 of the dummy gate electrodes 210b and 212b. The interlayer dielectric layer 226 peripherally surrounds the dummy gate structures 210 and 212. In some examples, the planarization step is performed by using a CMP technique. In some exemplary examples, a top 232 of the interlayer dielectric layer 226 has at least one concave 234.

At operation 308, as shown FIG. 2G, an interface layer 236 is formed on the interlayer dielectric layer 226 and the dummy gate structures 210 and 212. A material forming the interface layer 236 is different from that forming the interlayer dielectric layer 226. The interface layer 236 is harder to be removed than the interlayer dielectric layer 226. For example, the operation of forming the interface layer 236 may be performed using a deposition process, an implant process, a plasma treatment process or an oxidization process. In the examples that the interface layer 236 is formed using the deposition process, a selective ALD process may be used to form the interface layer 236. In the examples that the interface layer 236 is formed using the implant process, the implant process may be performed with a high dose concentration and shallow depth. In the examples that the interface layer 236 is formed using the plasma treatment process, the plasma treatment process may be performed using $N_2$ as a working gas. In the examples that the interface layer 236 is formed using the oxidization process, the oxidization process may be performed using hydrogen peroxide ($H_2O_2$), tartaric acid ($C_4H_6O_6$) or citric acid ($C_6H_8O_7$) as an oxidant.

At operation 310, as shown in FIG. 2H, openings 238 and 240 are formed in the interface layer 236 to expose the top 228 of the dummy gate electrode 210b and the top 230 of the dummy gate electrode 212b by using a photolithography technique and an etching technique, such as a dry etching technique.

At operation 312, the dummy gate electrodes 210b and 212b are replaced with two gate electrodes 246 and 248 to complete the fabrication of gate structures 250 and 252, as shown in FIG. 2J. The gate structure 250 includes the gate dielectric layer 210a and the gate electrode 246 on the gate dielectric layer 210a, and the gate structure 252 includes the gate dielectric layer 212a and the gate electrode 248 on the gate dielectric layer 212a. In some examples, in the operation of replacing the dummy gate electrodes 210b and 212b, the dummy gate electrodes 210b and 212b are removed respectively through the openings 238 and 240 by using, for example, a dry etching technique and/or a wet etching technique. As shown in FIG. 2I, after the dummy gate electrodes 210b and 212b are removed, cavities 242 and 244 are formed in the interlayer dielectric layer 226 to respectively expose the gate dielectric layers 210a and 212a.

After the dummy gate electrodes 210b and 212b are removed, a gate material layer (not shown) is formed to fill the cavities 242 and 244 and to cover the interface layer 236. The gate material layer may have a CMP selectivity with respect to the interface layer 236. The gate material layer may be formed from metal, such as tungsten. Next, a CMP process is performed on the gate material layer to remove a portion of the gate material layer overlying the interface layer 236, so as to form the gate electrodes 246 and 248 in the cavities 242 and 244 and expose the interface layer 236.

In some examples, after the gate electrodes 246 and 248 are formed, the interface layer 236 is removed to expose the top 232 of the interlayer dielectric layer 226 by using, for example, an etching technique. Then, as shown in FIG. 2K, a material layer 258 is formed on the top 232 of the interlayer dielectric layer 226 and fills the concave 234 to complete the fabrication of a semiconductor device 260. In the operation of forming the material layer 258, the material layer 258 may be deposited and planarized. Thus, a top surface 262 of the material layer 258 is a flat surface. In some exemplary examples, the top surface 262 of the material layer 258 is elevated at the same level with a top 254 of the gate electrode 246 and a top 256 of the gate electrode 248.

In accordance with an embodiment, the present disclosure discloses a semiconductor device. The semiconductor device includes a substrate, two gate structures, an interlayer dielectric layer and a material layer. The substrate has at least two device regions separated by at least one isolation structure which is disposed in the substrate, and each of the device regions includes two doped regions disposed in the substrate. The gate structures are respectively disposed on the device regions. In each of the device regions, the doped regions are respectively disposed at two opposite sides of the gate structure. The interlayer dielectric layer is disposed over the substrate and peripherally surrounds the gate structures. A top of the interlayer dielectric layer has at least one concave. The material layer fills the at least one concave. The material layer has a top surface which is elevated at the same level with top surfaces of the gate structures, and a ratio of a thickness of a thickest portion of the material layer to a pitch of the gate structures ranges from about 1/30 to about 1/80.

In accordance with another embodiment, the present disclosure discloses a method for manufacturing a semiconductor device. In this method, a substrate is provided, in which the substrate is provided to have at least two device regions separated by at least one isolation structure which is disposed in the substrate. Two dummy gate structures are formed on the device regions respectively, in which each of the dummy gate structures includes a dummy gate electrode. Various doped regions are formed in the substrate. Each of the device regions includes two of the doped regions disposed at two opposite sides of each of the dummy gate structures. An interlayer dielectric layer is formed on the substrate to peripherally surround the dummy gate structures. An interface layer is formed on the interlayer dielectric layer and the dummy gate structures. A material forming the interface layer is different from a material forming the interlayer dielectric layer. Openings are formed in the interface layer to respectively expose tops of the dummy gate electrodes. The dummy gate electrodes are replaced with two gate electrodes.

In accordance with yet another embodiment, the present disclosure discloses a method for manufacturing a semiconductor device. In this method, a substrate is provided. The substrate is provided to have at least two device regions separated by at least one isolation structure which is disposed in the substrate. Two dummy gate structures are formed on the device regions respectively, in which each of the dummy gate structures includes a dummy gate electrode. Two spacers are formed on the substrate to peripherally surround the dummy gate structures respectively. Various doped regions are formed in the substrate. Each of the device regions includes two of the doped regions disposed at two opposite sides of each of the dummy gate structures. An etching stop layer is formed to cover the substrate, the doped regions, the spacers and the dummy gate structures. An interlayer dielectric material layer is formed to cover the etching stop layer. A planarization step is performed on the interlayer dielectric material layer to remove a portion of the interlayer dielectric material layer and a portion of the etching stop layer to form an interlayer dielectric layer and expose tops of the dummy gate electrodes. An interface layer is formed on the interlayer dielectric layer and the tops of the dummy gate electrodes. A material forming the interface layer is different from a material forming the interlayer dielectric layer. Openings are formed in the interface layer to expose the tops of the dummy gate electrodes. The dummy gate electrodes are removed to form two cavities in the interlayer dielectric layer. A gate material layer is formed to fill the cavities and to cover the interface layer. A chemical mechanical polishing process is performed on the gate material layer to remove a portion of the gate material layer to form two gate electrodes in the cavities and expose the interface layer. The interface layer is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a first gate structure and a second gate structure over a substrate;
   forming an etching stop layer over the first gate structure and between the first gate structure and the second gate structure;
   forming a dielectric layer over the etching stop layer, over the first gate structure, and between the first gate structure and the second gate structure;
   etching the dielectric layer and the etching stop layer to expose the first gate structure, wherein a portion of the dielectric layer between the first gate structure and the second gate structure has a concave top surface after the etching the dielectric layer and the etching stop layer to expose the first gate structure;
   forming an interface layer over the first gate structure and over the concave top surface of the portion of the dielectric layer;
   etching the interface layer to define an opening overlying the first gate structure, the opening re-exposing the first gate structure, wherein:
      a spacer surrounds the first gate structure, and
      the interface layer continues to overlie the spacer after the etching the interface layer is complete; and
   replacing a dummy gate electrode of the first gate structure with a gate electrode through the opening.

2. The method of claim 1, wherein the portion of the dielectric layer having the concave top surface is spaced apart from the first gate structure by the etching stop layer.

3. The method of claim 1, comprising:
   removing the interface layer after the replacing to expose the concave top surface.

4. The method of claim 3, comprising:
   forming a material layer over the concave top surface after the removing, wherein a top surface of the material layer is elevated at the same level with a top surface of the first gate structure.

5. The method of claim 3, comprising:
   forming a material layer over the concave top surface after the removing, wherein a ratio of a thickness of a thickest portion of the material layer to a pitch of the first gate structure and the second gate structure ranges from 1/30 to 1/80.

6. The method of claim 3, comprising:
   forming a material layer over the concave top surface after the removing, wherein the material layer is a metal.

7. The method of claim 1, wherein the portion of the dielectric layer having the concave top surface overlies a first doped region adjacent the first gate structure and a second doped region adjacent the second gate structure, the first doped region separated from the second doped region by an isolation structure.

8. The method of claim 1, comprising:
   implanting a first dopant having a first conductivity type into the substrate to form a first doped region adjacent the first gate structure; and
   implanting a second dopant having a second conductivity type, different than the first conductivity type, into the substrate to form a second doped region adjacent the second gate structure, wherein:
      the forming a dielectric layer over the first gate structure and between the first gate structure and the second gate structure comprises forming the dielectric layer to overlie the first doped region and the second doped region, and
      the portion of the dielectric layer having the concave top surface overlies the first doped region and the second doped region.

9. The method of claim 1, wherein the interface layer has a first etch selectivity and the dummy gate electrode has a second etch selectivity different than the first etch selectivity.

10. The method of claim 1, wherein the etching the dielectric layer and the etching stop layer comprises performing a chemical mechanical polishing process to concurrently etch the dielectric layer and the etching stop layer.

11. The method of claim 1, wherein after the etching the dielectric layer and the etching stop layer, a top surface of the dielectric layer, a top surface of the etching stop layer, and a top surface of the first gate structure are co-planar.

12. A method of forming a semiconductor device, comprising:
   forming a first gate structure and a second gate structure over a substrate;
   forming an etching stop layer between the first gate structure and the second gate structure;
   forming a dielectric layer over the etching stop layer and between the first gate structure and the second gate structure, wherein:
      the dielectric layer has a concave top surface, and
      the dielectric layer is spaced apart from the first gate structure by the etching stop layer;
   forming an interface layer over the first gate structure and over the dielectric layer;
   etching the interface layer to define an opening overlying the first gate structure, wherein the opening is defined by the first gate structure and an exposed sidewall of the interface layer;
   replacing a dummy gate electrode of the first gate structure with a gate electrode through the opening; and
   replacing the interface layer with a material layer after the replacing a dummy gate electrode, wherein the material layer is a metal.

13. The method of claim 12, wherein:
   the forming an etching stop layer comprises forming the etching stop layer over the first gate structure, and
   the forming a dielectric layer comprises forming the dielectric layer over the first gate structure.

14. The method of claim 13, comprising:
   planarizing the dielectric layer and the etching stop layer to expose a top surface of the first gate structure.

15. The method of claim 12, wherein the replacing the interface layer comprises:
   removing the interface layer after the replacing a dummy gate electrode to expose the concave top surface; and
   forming the material layer over the concave top surface after the removing.

16. The method of claim 15, wherein the forming a material layer comprises:
   forming the material layer such that a top surface of the material layer is elevated at the same level with a top surface of the first gate structure.

17. A method of forming a semiconductor device, comprising:

forming a first gate structure over a first device region of a substrate between a first doped region and a second doped region of the first device region and forming a second gate structure over a second device region of the substrate between a first doped region and a second doped region of the second device region, wherein the first device region is separated from the second device region by an isolation structure;

forming an etching stop layer over the substrate, over the first gate structure, and peripherally surrounding the first gate structure;

forming an interlayer dielectric layer over the etching stop layer;

removing a portion of the etching stop layer overlying the first gate structure after the forming an interlayer dielectric layer;

replacing a dummy gate electrode of the first gate structure with a gate electrode after the removing; and forming a material layer over the interlayer dielectric layer after the replacing a dummy gate electrode, wherein:

at a smallest distance between the material layer and the first gate structure, the material layer is separated from the first gate structure by the etching stop layer and a spacer disposed between the first gate structure and the etching stop layer, the material layer has a top surface which is elevated at the same level with a top surface of the first gate structure, and the material layer is a metal.

18. The method of claim 17, wherein a ratio of a thickness of a thickest portion of the material layer to a pitch of the first gate structure and the second gate structure ranges from 1/30 to 1/80.

19. The method of claim 17, comprising:

forming an interface layer over the interlayer dielectric layer, wherein the forming a material layer comprises replacing the interface layer with the material layer.

20. The method of claim 19, comprising:

etching the interface layer to define an opening overlying the first gate structure, wherein the replacing a dummy gate electrode comprises replacing the dummy gate electrode of the first gate structure with the gate electrode through the opening before the replacing the interface layer.

* * * * *